(12) United States Patent
Mulkens et al.

(10) Patent No.: US 6,753,946 B2
(45) Date of Patent: Jun. 22, 2004

(54) LITHOGRAPHIC APPARATUS AND DEVICE MANUFACTURING METHOD

(75) Inventors: Johannes Catharinus Hubertus Mulkens, Maastricht (NL); Amo Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/329,768

(22) Filed: Dec. 27, 2002

(65) Prior Publication Data

US 2003/0197843 A1 Oct. 23, 2003

(30) Foreign Application Priority Data

Dec. 28, 2001 (EP) .............................................. 01310936

(51) Int. Cl.[7] ........................ G03B 27/54; G03B 27/42; G03B 27/72
(52) U.S. Cl. ............................... 355/67; 355/53; 355/71
(58) Field of Search .............................. 355/52, 53, 55, 355/67–71; 356/399–401; 250/548; 359/727, 730

(56) References Cited

U.S. PATENT DOCUMENTS

| 3,545,854 | A | | 12/1970 | Olsson |
| 3,584,948 | A | | 6/1971 | Herriott |
| 3,656,849 | A | | 4/1972 | Lu ............................... 355/46 |
| 3,791,275 | A | | 2/1974 | Bryngdahl ................... 95/18 R |
| 3,985,439 | A | | 10/1976 | Kiemle ......................... 355/46 |
| 6,061,188 | A | * | 5/2000 | Kamon ........................ 359/727 |
| 6,312,134 | B1 | * | 11/2001 | Jain et al. .................... 359/855 |
| 6,424,404 | B1 | * | 7/2002 | Johnson ....................... 355/44 |
| 6,509,955 | B2 | * | 1/2003 | Mei et al. ..................... 355/53 |

FOREIGN PATENT DOCUMENTS

| WO | WO82/02623 | 8/1985 |
| WO | WO01/35451 | 5/2001 |

* cited by examiner

*Primary Examiner*—Henry Hung Nguyen
(74) *Attorney, Agent, or Firm*—Pillsbury Winthrop LLP

(57) ABSTRACT

A lithographic apparatus includes a spatial light modulator and a the projection system having a beam splitter constructed and arranged to split the patterned beam into patterned beam fractions and project them onto separate target portions on the substrate.

11 Claims, 3 Drawing Sheets

LITHOGRAPHIC APPARATUS AND DEVICE MANUFACTURING METHOD

BACKGROUND OF THE INVENTION

1. Field of the Invention

The present invention relates to a lithographic projection apparatus and a device manufacturing method.

2. Description of the Related Art

The term "programmable patterning device" as here employed should be broadly interpreted as referring to device that can be used to endow an incoming radiation beam with a patterned cross-section, corresponding to a pattern that is to be created in a target portion of the substrate. The term "light valve" or "spatial light modulator" (SLM) can also be used in this context. Generally, the pattern will correspond to a particular functional layer in a device being created in the target portion, such as an integrated circuit or other device (see below). An example of such a patterning device is programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

In apparatus using a programmable patterning device, such as an SLM, a critical issue is to ensure that the apparatus has sufficient throughput (the number of wafers processed in a given time). The throughput is determined by the rate at which the SLM can be reconfigured, which in turn is limited by the rate at which the data setting the SLM can be processed. Limits on the data processing rate arise from limits on data transfer rates, limits on data decompression and the extent to which the data must contain redundancies to ensure that the SLM is correctly reconfigured. The limit on the speed of data processing also limits the size of the SLM that can be used. Therefore, to expose the entire required image on the surface of the substrate, the image to be projected onto the substrate is divided into sections, and the SLM configured to project each section in turn. This means that the SLM must frequently be reconfigured, further reducing the throughput.

SUMMARY OF THE INVENTION

It is an aspect of the present invention to provide a lithographic projection apparatus, especially one using a programmable patterning device, that can be operated with a higher throughput.

This and other aspects are achieved according to the invention in a lithographic apparatus including a radiation system constructed and arranged to supply a projection beam of radiation; a programmable patterning device constructed and arranged to pattern the projection beam according to a desired pattern; a substrate table constructed and arranged to hold a substrate; a projection system constructed and arranged to project the patterned beam onto a target portion of the substrate, the projection system including a beam splitting unit constructed and arranged to split the patterned beam to form a plurality of patterned beam fractions; first projection optics constructed and arranged to project a first patterned beam fraction onto a first target portion of a substrate; and second projection optics constructed and arranged to project a second patterned beam fraction onto second target portion of a substrate.

This apparatus is advantageous as each substrate typically requires a plurality of copies of the same image exposed on it to form a plurality of copies of the same device. Therefore, by projecting more than one copy of the same image onto the substrate at once, the time taken to expose all the images on the substrate will be reduced, thereby improving the throughput. The apparatus is also advantageous because the multiple images can be projected onto the substrate using only a single SLM or other programmable patterning device, thereby reducing the total cost of the apparatus.

In a yet further preferred embodiment of the present invention, the apparatus further comprises a further beam splitting unit constructed and arranged to split one of the patterned beam fractions to produce further patterned beam fractions. This is advantageous since the greater the number of images targeted on the substrate, the higher the throughput of the apparatus.

According to a yet further embodiment of the present invention, the projection System comprises a beam intensity adjusting device constructed and arranged to adjust the beam intensity of the patterned beam fractions. This allows the patterned beam fractions to be adjusted such that they each have substantially the same beam intensity and therefore the portions of the substrate targeted by each patterned beam fraction will be equally exposed.

According to a yet further embodiment of the present invention, the projection System further comprises a reduction device constructed and arranged to provide a reduced image of the pattern provided by the programmable patterning device. This is advantageous since the pixel size of the SLM is larger than the critical feature size required on the substrate. The size of the image therefore needs to be reduced. Furthermore, by reducing the size of the image of each of the patterned beam fractions separately, each can be adjusted to be the correct size.

According to a yet further embodiment of the present invention, the projection system further comprises an adjusting device constructed and arranged to separately adjust the focus and/or the lateral position of the image of each of the patterned beam fractions. This ensures that the image of each of the patterned beam fractions is correctly projected on the substrate.

The beam splitting device may be a partially reflective or refractive device.

According to a further aspect of the invention there is provided:

a device manufacturing method including providing a substrate that is at least partially covered by a layer of radiation sensitive material; providing a projection beam of radiation using a radiation system; using a programmable patterning device to endow the first projection beam with a pattern in its cross-section; projecting the patterned projection beam of radiation onto a target portion of the layer of radiation-sensitive material; splitting the patterned beam of radiation into a plurality of patterned beam fractions prior to projecting it onto the substrate; and separately projecting the patterned beam fractions onto separate target portions of a substrate.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
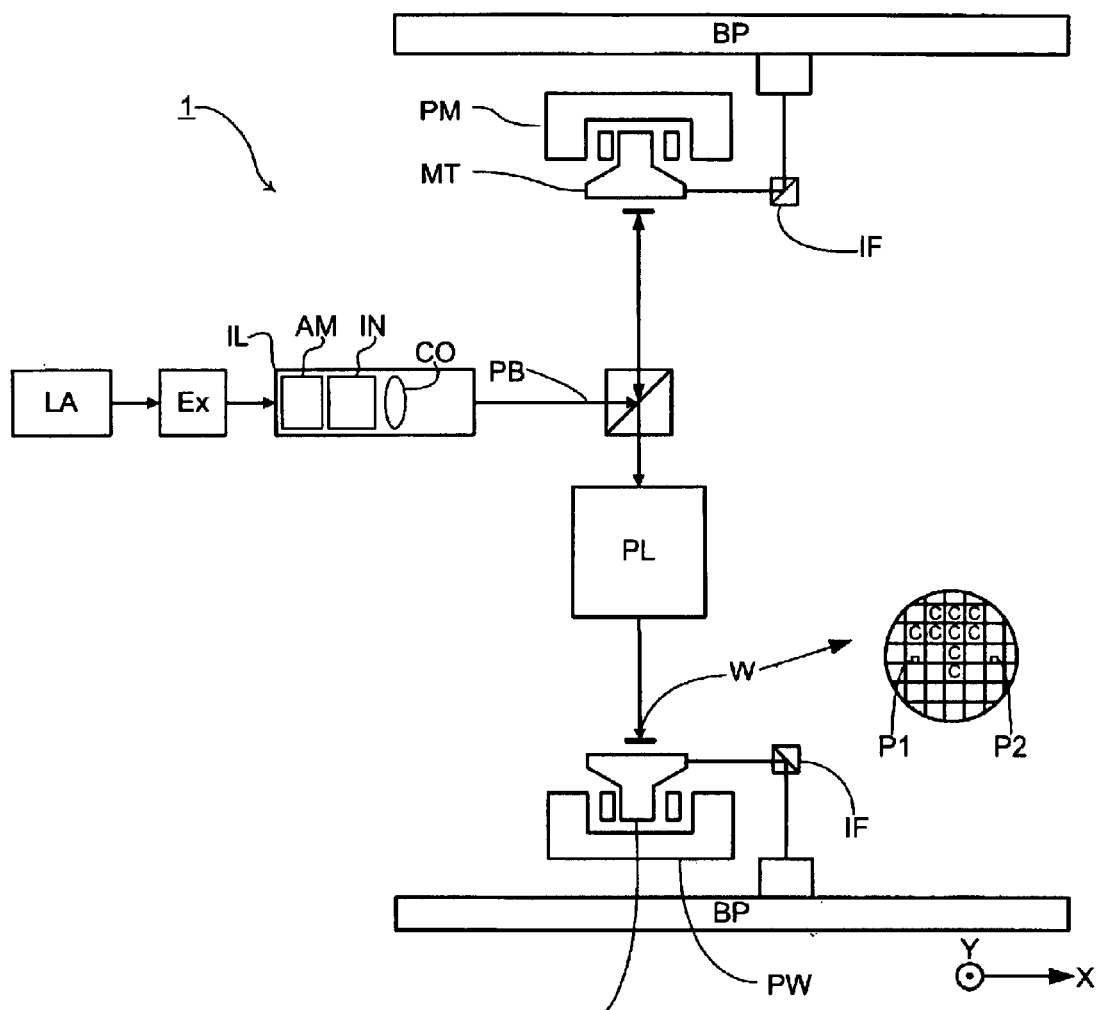
FIG. 1 depicts a lithographic projection apparatus according to an embodiment of the invention.

FIG. 1 schematically depicts a lithographic projection apparatus 1 according to the present invention including a base plate BP; a radiation system Ex, IL, constructed and arranged to supply a projection beam PB of radiation (e.g. UV radiation), which in this particular case also comprises a radiation source LA; a first object (mask) table MT provided with a mask holder constructed and arranged to hold a programmable patterning device MA (e.g. an SLM), and connected to a first positioning device PM constructed and arranged to accurately position the programmable patterning device MA with respect to a projection system or lens PL; a second object (substrate) table WT provided with a substrate holder constructed and arranged to hold a substrate W (e.g. a resist-coated silicon wafer), and connected to a second positioning device PW constructed and arranged to accurately position the substrate W with respect to the projection system or lens PL. The projection system or lens PL (e.g. a quartz and/or $CaF_2$ lens system or a catadioptric system comprising lens elements made from such materials, or a mirror system) is constructed and arranged to image an irradiated portion of the programmable patterning device MA onto a target portion C (e.g. comprising one or more dies) of the substrate W.

As here depicted, the apparatus is of a reflective type (e.g. has a reflective programmable patterning device). However, in general, it may also be of a transmissive type, for example (e.g. with a transmissive programmable patterning device). Alternatively, the apparatus may employ another kind of patterning device, such as a programmable LCD array of a type as referred to above.

The source LA (e.g. an excimer laser) produces a beam of radiation. This beam is fed into an illumination system (illuminator) IL, either directly or after having traversed a conditioning device, such as a beam expander Ex, for example. The illuminator IL may comprise an adjusting device AM constructed and arranged to set the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the programmable patterning device MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the programmable patterning device MA, which is held on a mask table MT. Having been reflected by the programmable patterning device MA, the beam PB passes through the lens PL, which focuses the beam PB onto a target portion C of the substrate W. With the aid of the second positioning device PW and interferometers IF, the substrate table WT can be moved accurately, e.g. so as to position different target portions C in the path of the beam PB. Similarly, the first positioning device PM can be used to accurately position the programmable patterning device MA with respect to the path of the beam PB, e.g. during a scan. The first positioning device PM may be omitted, in which case the position of the programmable patterning device MA relative to the beam PB will be fixed. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in three different modes:

1. In step mode, the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution;
3. In pulse mode, the mask table MT is kept essentially stationary and an entire image of the programmable patterning device MA is projected onto a target portion C of the substrate. The substrate table WT is moved with an essentially constant speed such that the projection beam PB is caused to scan a line across the substrate W. The pulses of the radiation system are timed such that successive target portions C that are exposed on the substrate are adjacent to one another. Consequently, once the projection beam has scanned an entire line of the substrate W the complete pattern for that line is exposed on the substrate. The process is repeated until the complete substrate has been exposed line by line.

Figure 2:
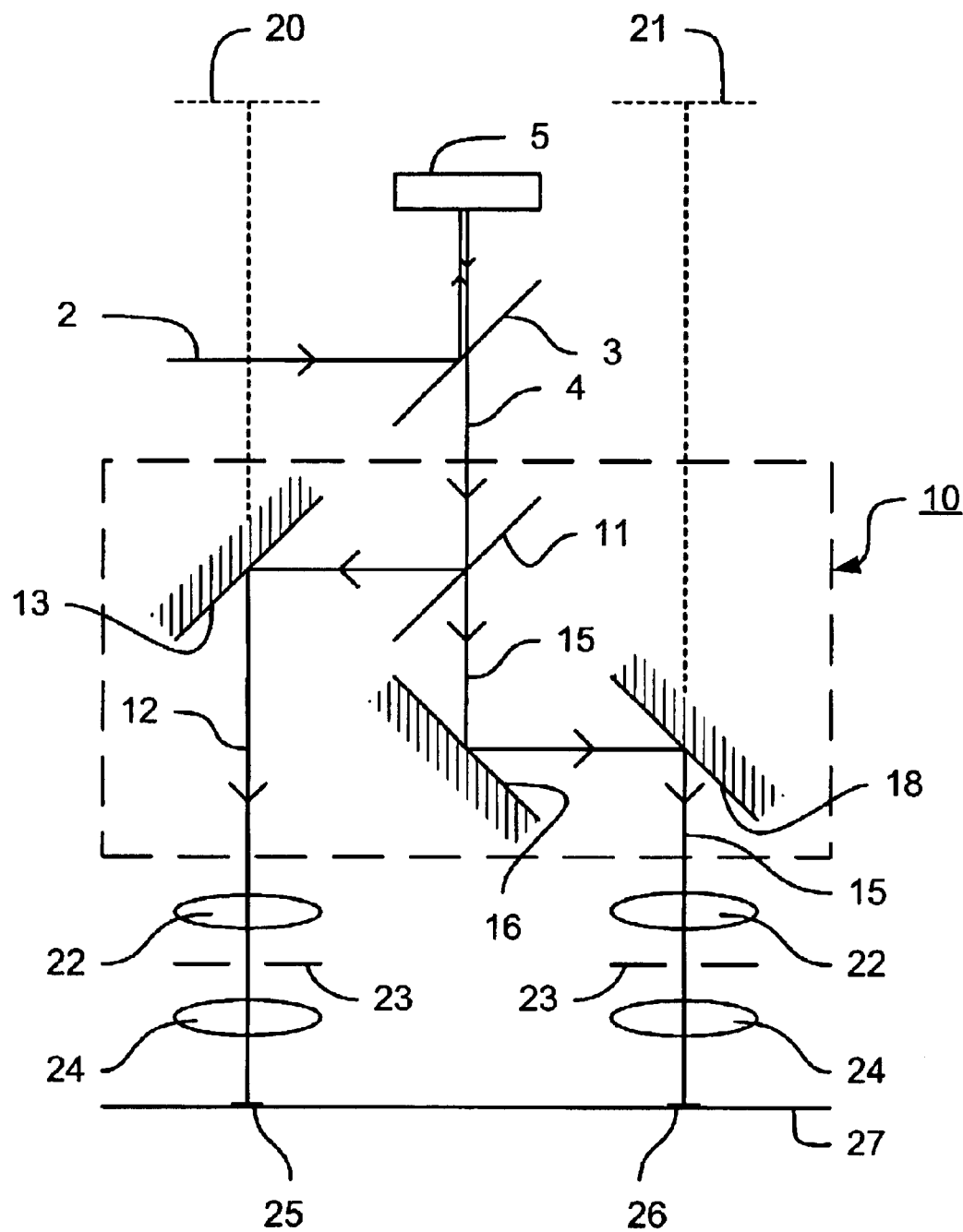
FIG. 2 schematically shows an apparatus according to an embodiment of the present invention.

FIG. 2 schematically shows part of an apparatus according to the present invention. As shown, a beam of radiation 2 is incident on a first beam splitter 3. The radiation is reflected from the beam splitter 3 to the SLM 5. The beam 2 is reflected from the SLM as a patterned beam 4, the pattern being determined by the configuration of the SLM 5. The patterned beam 4 enters a beam splitting unit 10.

In the beam splitting unit 10, the patterned beam 4 is split by a second beam splitter 11 into first and second patterned beam fractions 12, 15. The first patterned beam fraction 12 is reflected by a mirror 13 and then projected via optical elements 22, 24 and an aperture 23 onto the substrate 27. The second patterned beam fraction 15 is reflected by mirrors 16, 18 and projected similarly via elements 22, 23, 24 onto the substrate 27.

The first image 25 projected on the substrate 27, corresponding to the first patterned beam fraction 12, is a real image of a virtual image 20 of the SLM 5. Similarly, the second image 26 projected onto the substrate 27, corresponding to the second patterned beam fraction 15, is a real image of a virtual image 21 of the SLM 5. In this way two images of the SLM are projected onto the substrate simultaneously, thereby reducing the time taken to project all the required images on the substrate.

Although FIG. 2 shows a preferred beam splitting unit 10 for splitting the patterned beam, other devices capable of splitting the patterned beam may also be used and fall within the scope of the present invention. Furthermore, the present invention may be used with programmable patterning devices other than the SLM shown.

Figure 3:
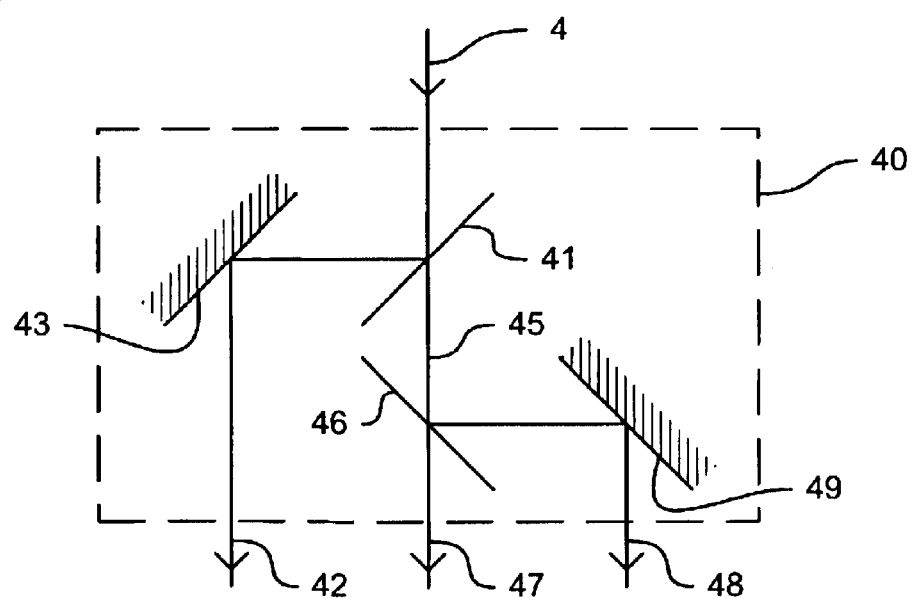
FIG. 3 depicts a beam splitting device according to another embodiment of the present invention.

FIG. 3 shows an alternative beam splitting unit 40 to split the patterned beam 4. In this case, the patterned beam 4 is split by a beam splitter 41 producing two patterned beam fractions 42, 45. The first patterned beam fraction 42 is reflected by a mirror 43 to produce an output patterned beam fraction. The second patterned beam fraction 45 is split by a further beam splitter 46 to produce a second output patterned beam fraction 47 and a third patterned beam fraction, which is output after being reflected by a mirror 49. This produces three patterned beam fractions which could be projected onto the substrate to form three images.

In embodiments of the present invention, each beam splitter used may be one of, for example, a partially reflective beam splitter such as a cube beam splitter, a plate beam splitter or a pellicle or a refractive beam splitter such as a double refractive crystal that generates two beams with orthogonal polarization states.

Figure 4:
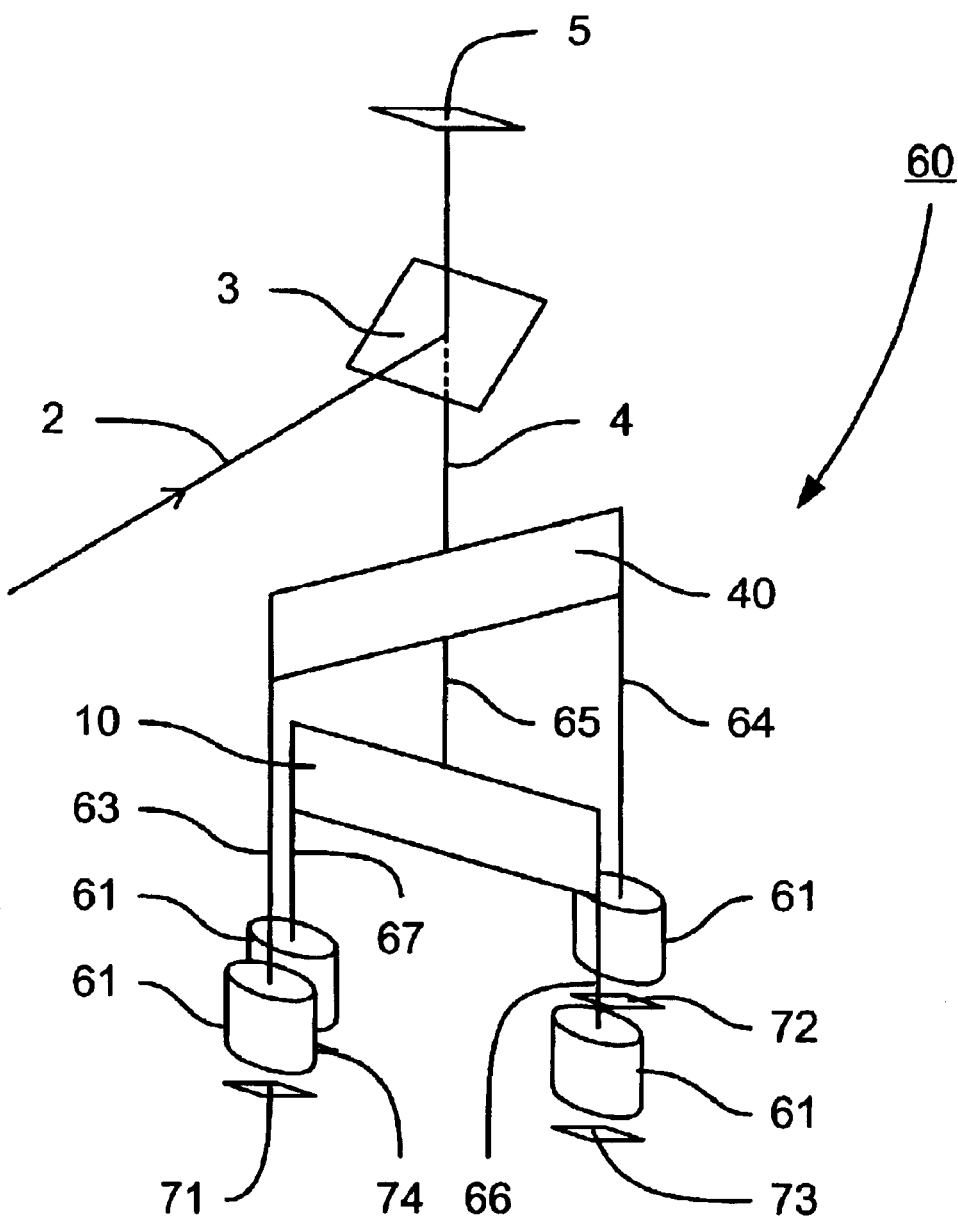
FIG. 4 depicts a further embodiment of the present invention.

FIG. 4 shows a further embodiment 60 of the apparatus according to the present invention. The radiation beam 2 is reflected off the SLM 5 via the beam splitter 3 to form a patterned beam 4. The patterned beam is split by a beam splitting unit 40 to produce three patterned beam fractions 63, 64, 65. The first and second patterned beam fractions 63, 64 are projected via projection optics 61 to form a first image 71 and a second image 72, respectively, on the substrate. The third patterned beam fraction 65 is split using a beam splitting unit 10 to produce the third and fourth patterned beam fractions 66, 67. The patterned beam fractions 66, 67 are projected by projection optics 61 to produce a third image 73 and a fourth image 74, respectively, on the substrate. By this device a single patterning device 5 is used to produce four images 71, 72, 73, 74 on the substrate simultaneously, reducing the time taken to expose all the images on the substrate by a factor of approximately 4.

It will be appreciated that any combination of patterned beam splitting units 10, 40 may be used to produce any number of patterned beam fractions from a single patterned beam. Preferably as many patterned beam fractions as can be produced without their intensities being reduced below a given threshold are used. The main limiting factor on the number of patterned beam fractions that may be produced is the intensity of the initial beam of radiation that is patterned by the patterning device. The greater the number of patterned beam fractions produced, the greater the intensity of the initial beam of radiation that must be used in order to ensure that the intensity of the patterned beam fractions is not so low that the required exposure time becomes excessively long.

The projection optics used to project the patterned beam images onto the substrate have a variety of functions. A first function is to project on the substrate a reduced image of the pattern provided by the SLM. Such a reduction of image size with respect to pattern size is appropriate because the pixels of the SLM are typically larger than the critical features that must be projected onto the substrate. A second function can, for example, be to provide for each patterned beam fraction separately an adjustment device for the amount of reduction, and/or the focal position of the reduced image along the optical axis of the projection optics, and/or lateral position of the reduced image in a plane perpendicular to the optical axis of the projection optics.

Each patterned beam fraction preferably also passes through an optical element for attenuating the corresponding beam fraction intensity. Therefore, the intensity of each beam can be adjusted such that each of the patterned beam fractions has substantially the same intensity and therefore each image projected on the substrate requires substantially the same exposure time. For example, the optical element for attenuating the beam intensity can be a filter with calibrated optical attenuation. Any of the beam splitters 3, 11, 41 and 46 can be embodied as a polarizing beam splitter. Typically, the use of a polarizing beam splitter alleviates the problem of loss of intensity due to absorption of radiation in the beam splitter. Patterned beam fractions, such as, for example, patterned beam fraction 12 in FIG. 2 or patterned beam fraction 67 in FIG. 4, have, in the presence of one or more of the polarizing beam splitters, a non-vanishing degree of polarization. Such a state of polarization enables the use of a radiation polarizing element as optical element for attenuating the corresponding patterned beam fraction intensity. For example, a patterned beam fraction can have a substantial degree of linear polarization, and the radiation polarizing element can be embodied as a linear polarizer. An advantage of such an embodiment is that the beam intensity attenuation can be adjusted by a rotational adjustment of the linear polarizer. The rotational adjustment comprises a rotation of the linear polarizer about an axis parallel to the direction of propagation of the patterned beam fraction traversing the linear polarizer. To alleviate a detrimental effect that the degree of linear polarization of a patterned beam may have on the resolution of the projection apparatus, and in particular on the difference of the resolution for mutually orthogonal elongated pattern features, each of the group of optical elements 22, 23 and 24 in FIG. 2 or each of the projection optics 61 in FIG. 4 can be provided with a radiation polarizing element which transforms a state of linear polarization of electromagnetic radiation into a state of circular polarization.

Each patterned beam fraction is preferably also projected through adjustable optics to adjust the focus and/or lateral position of each image. This ensures that each of the images projected on the substrate can be produced with the required quality and at the required position.

In a specific embodiment of the invention, each of the projection optics 61, such as for example shown in FIG. 4, may comprise a common group of optical elements 23, 24, 25 traversed by the patterned beam fraction. The common group is positioned in the optical path between the SLM 5 and the beam splitting unit 40, and can be used, for example, for reduction adjustments common to the patterned beam fractions and the corresponding images.

Although the above description has described the plurality of patterned beam fractions being projected onto a single substrate, it will be appreciated that some patterned beam fractions could be projected onto other substrates, allowing two or more substrates to be exposed simultaneously.

While specific embodiments of the invention have been described above, it will be appreciated that the invention may be practiced otherwise than as described. The description is not intended to limit the invention.

What is claimed is:

1. A lithographic projection apparatus, comprising:
   a radiation system constructed and arranged to provide a projection beam of radiation;
   a programmable patterning device constructed and arranged to pattern the projection beam according to a desired pattern;
   a substrate table for holding a substrate; and
   a projection system for projecting the patterned beam onto a target portion of the substrate, wherein projection system comprises:

a beam splitting device constructed and arranged to split the patterned beam to form a plurality of patterned beam fractions;

first projection optics constructed and arranged to project a first patterned beam fraction onto a first target portion of a substrate; and second projection optics constructed and arranged to project a second patterned beam fraction onto a second target portion of a substrate.

2. An apparatus according to claim 1, wherein the projection system further comprises a second beam splitting device constructed and arranged to split at least one of the patterned beam fractions to produce further patterned beam fractions.

3. An apparatus according to claim 1, wherein images projected by the patterned beam fractions are substantially identical.

4. An apparatus according to claim 1, wherein the projection system further comprises a beam intensity adjusting device constructed and arranged to adjust the intensity of at least one of the patterned beam fractions.

5. An apparatus according to claim 4, wherein the adjusting device comprises a filter with calibrated optical attenuation.

6. An apparatus according to claim 4, wherein the adjusting device comprises a radiation polarizing element.

7. An apparatus according to claim 1, wherein the projection system further comprises a reduction device constructed and arranged to provide a reduced image of the pattern provided by the programmable patterning device.

8. An apparatus according to claim 1, wherein the projection system further comprises a reduction device constructed and arranged to separately adjust the image size of each of the images provided by the patterned beam fractions.

9. An apparatus according to claim 1, wherein the projection system further comprises an adjusting device constructed and arranged to separately adjust at least one of the focus and lateral position of the image of each of the patterned beam fractions.

10. An apparatus according to claim 1, wherein the beam splitting device is refractive or partially reflective.

11. A device manufacturing method, comprising:

providing a substrate that is at least partially covered by a layer of radiation sensitive material;

providing a projection beam of radiation using a radiation system;

using a programmable patterning device to endow the projection beam with a pattern in its cross-section;

projecting the patterned beam of radiation onto a target portion of the layer of radiation-sensitive material;

splitting the patterned beam of radiation into a plurality of patterned beam fractions prior to projecting it onto the substrate; and separately projecting the patterned beam fractions onto separate target portions of a substrate.

* * * * *

UNITED STATES PATENT AND TRADEMARK OFFICE
CERTIFICATE OF CORRECTION

PATENT NO. : 6,753,946 B2
DATED : June 22, 2004
INVENTOR(S) : Mulkens et al.

Page 1 of 1

It is certified that error appears in the above-identified patent and that said Letters Patent is hereby corrected as shown below:

<u>Title page,</u>
Item [75], Inventors, replace "Amo Jan Bleeker" with -- Arno Jan Bleeker --.

Signed and Sealed this

Eighteenth Day of January, 2005

JON W. DUDAS
*Director of the United States Patent and Trademark Office*